(12) United States Patent
Tseng

(10) Patent No.: US 8,179,155 B2
(45) Date of Patent: May 15, 2012

(54) LAYOUT STRUCTURE OF ELECTRONIC ELEMENTS AND METHOD FOR ADDRESSING TO DETECT ELECTRONIC ELEMENTS

(75) Inventor: Hung-Hsu Tseng, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 437 days.

(21) Appl. No.: 12/494,230

(22) Filed: Jun. 29, 2009

(65) Prior Publication Data

US 2010/0327876 A1 Dec. 30, 2010

(51) Int. Cl.
*G01R 31/02* (2006.01)
(52) U.S. Cl. .................................. 324/762.01
(58) Field of Classification Search .................. None
See application file for complete search history.

(56) References Cited

U.S. PATENT DOCUMENTS

| 6,521,910 | B1 | 2/2003 | Lin |
| 7,123,044 | B2 * | 10/2006 | Orii et al. ................. 324/760.02 |
| 2004/0056252 | A1 * | 3/2004 | Kasai ............................... 257/72 |
| 2004/0095298 | A1 * | 5/2004 | Miyazawa ....................... 345/76 |
| 2011/0221733 | A1 * | 9/2011 | Sato ............................... 345/211 |

* cited by examiner

*Primary Examiner* — Jermele M Hollington
(74) *Attorney, Agent, or Firm* — Winston Hsu; Scott Margo

(57) ABSTRACT

A layout structure of electronic elements includes M*N electronic elements in a form of a matrix, a first test pad group disposed on a first side of the matrix and all electronic elements in the same linear section in the matrix electrically connect to a corresponding test pad in the first test pad group, and a second test pad group disposed on a second side of the matrix and all electronic elements in the same linear section in the matrix electrically connect to a corresponding test pad in the second test pad group.

33 Claims, 8 Drawing Sheets

LAYOUT STRUCTURE OF ELECTRONIC ELEMENTS AND METHOD FOR ADDRESSING TO DETECT ELECTRONIC ELEMENTS

BACKGROUND OF THE INVENTION

1. Field of the Invention

The present invention relates to a layout structure of electronic elements and a method for detecting an electronic element by means of addressing. In particular, the present invention relates to a high density layout structure of electronic elements and a method for detecting an electronic element in a high density layout structure by means of addressing.

2. Description of the Prior Art

In the standard semiconductor process, in order to evaluate the efficiency of each procedure and to confirm the performance of the elements after the procedures, a wafer acceptance test (WAT) is performed on the wafers. The wafer acceptance test includes electrical tests on the pads disposed around the peripheral regions of the dices. The main purposes of the wafer acceptance test are to confirm the stability of the semiconductor process as well as to enhance the yield of dices. By means of the wafer acceptance test, the quality and the stability of the wafers are somewhat ensured.

In order to carry out the test successfully, the test keys disposed around the peripheral regions of dices play an important role. For this purpose, test keys which are electrically connected to the electronic elements are formed. The test keys are usually formed on the scribe lines between the dices and electrically connected to the electronic elements through pads. The layout of the test keys are generally related to the numbers of the electrodes of the electronic elements. Depending on the numbers of the electrodes, an electronic element may be electrically connected to two to four pads.

FIG. 1 illustrates a current layout structure for test keys and electronic elements. The electronic element 10 is respectively and electrically connected to 4 pads, i.e. 21/22/23/24 respectively. In the limited area for the test pads, at most 20 pads are allowed to accommodate in a linear section, a line or a row for example, for a wafer acceptance test, and accordingly, at most 5 electronic elements 10 are arranged in a linear section. If the electronic elements have common electrodes, the number of the electronic elements may be doubled. Assume the size of the test key is 1540 µm*52.6 µm=51004 µm$^2$, so the average area occupied by each one of the electronic element 10 is 51004/5=16200.8 µm$^2$.

In order to lower the production cost, the critical dimension of the electronic elements in the wafer is getting smaller and smaller, so the available area for the test keys is getting smaller and smaller, too, and accordingly, insufficient. It is now an urgent issue to propose a high density layout structure for electronic elements to more economically accommodate more electronic elements to be tested in a smaller and smaller area in the test key regions for test keys.

SUMMARY OF THE INVENTION

The present invention therefore proposes a high density layout structure for electronic elements. The high density layout structure for electronic elements of the present invention may utilize the limited space in the test key region more economically to accommodate more electronic elements and the corresponding pads in a same area. Further, the present invention also proposes a method for detecting an electronic element by means of addressing in a high density layout structure for electronic elements. The method of the present invention may somewhat ensure the quality and the stability of electronic elements in wafers.

The present invention first proposes a high density layout structure for electronic elements. The high density layout structure includes M*N electronic elements in a form of a matrix, a first test pad group disposed on a first side of the matrix and all electronic elements in the same linear section in the matrix electrically connected to a corresponding test pad in the first test pad group, and a second test pad group disposed on a second side of the matrix, and all electronic elements in the same linear section in the matrix electrically connected to a corresponding test pad in the second test pad group. In one embodiment of the present invention, the first test pad group and the second test pad group are respectively electrically connected to a source, a drain, a gate and a base.

The present invention also proposes a method for detecting an electronic element by means of addressing. First, a layout structure is provided. The layout structure includes M*N electronic elements in a form of a matrix, a first test pad group disposed on a first side of the matrix and all electronic elements in the same linear section in the matrix electrically connected to a corresponding test pad in the first test pad group, and a second test pad group disposed on a second side of the matrix, and all electronic elements in the same linear section in the matrix electrically connected to a corresponding test pad in the second test pad group. Second, a corresponding test pad in the first test pad group is electrically connected to activate all electronic elements in the same linear section of the matrix. Then, a corresponding test pad in the second test pad group is electrically connected to select an electronic element by means of addressing so a specific electronic element is detected. In another embodiment of the present invention, the layout structure further includes a third test pad group disposed on a third side of the matrix. All the first test pad group, the second test pad group and the third test pad group are different.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
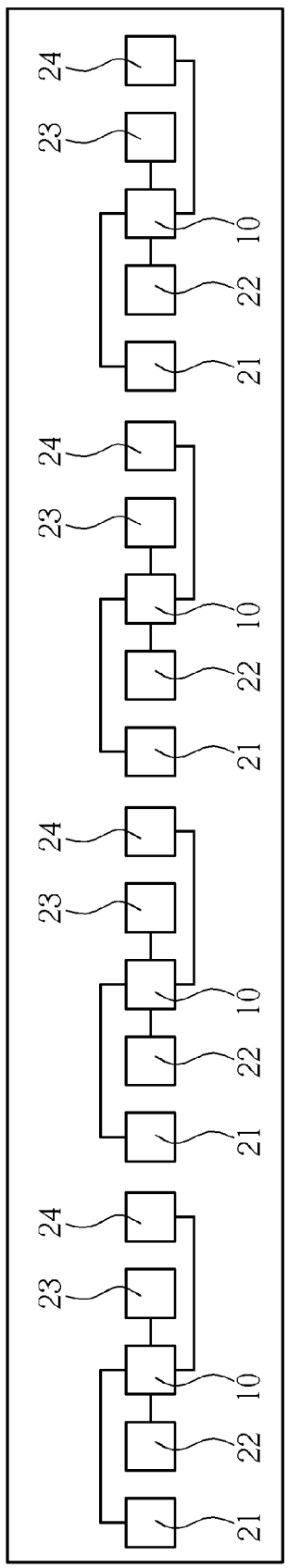
FIG. 1 illustrates a current layout structure for test keys and electronic elements.
Figure 2A:
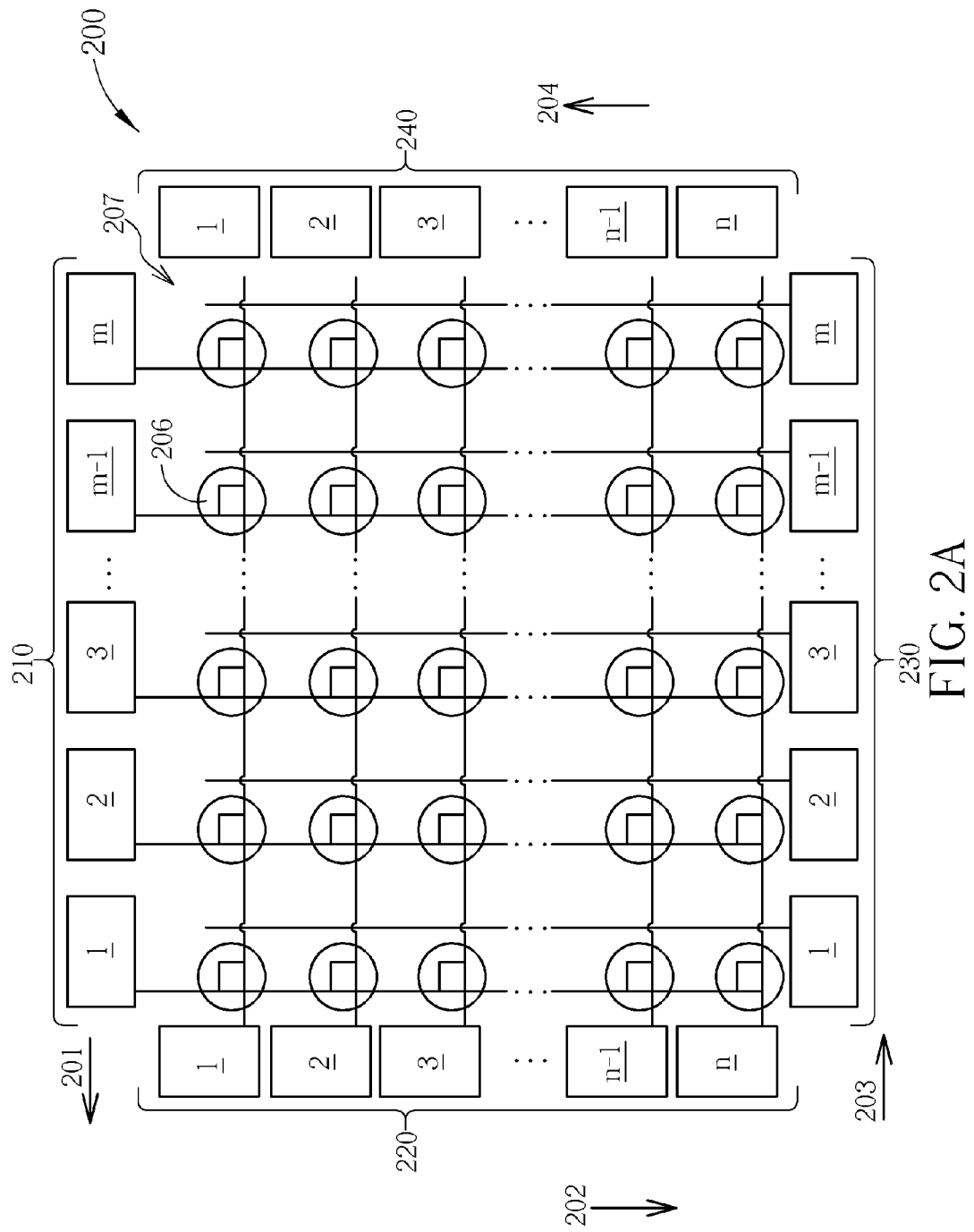
FIGS. 2A, 2B, 2C and 2D illustrate an example of the high density layout structure for electronic elements of the present invention.
Figure 2B:
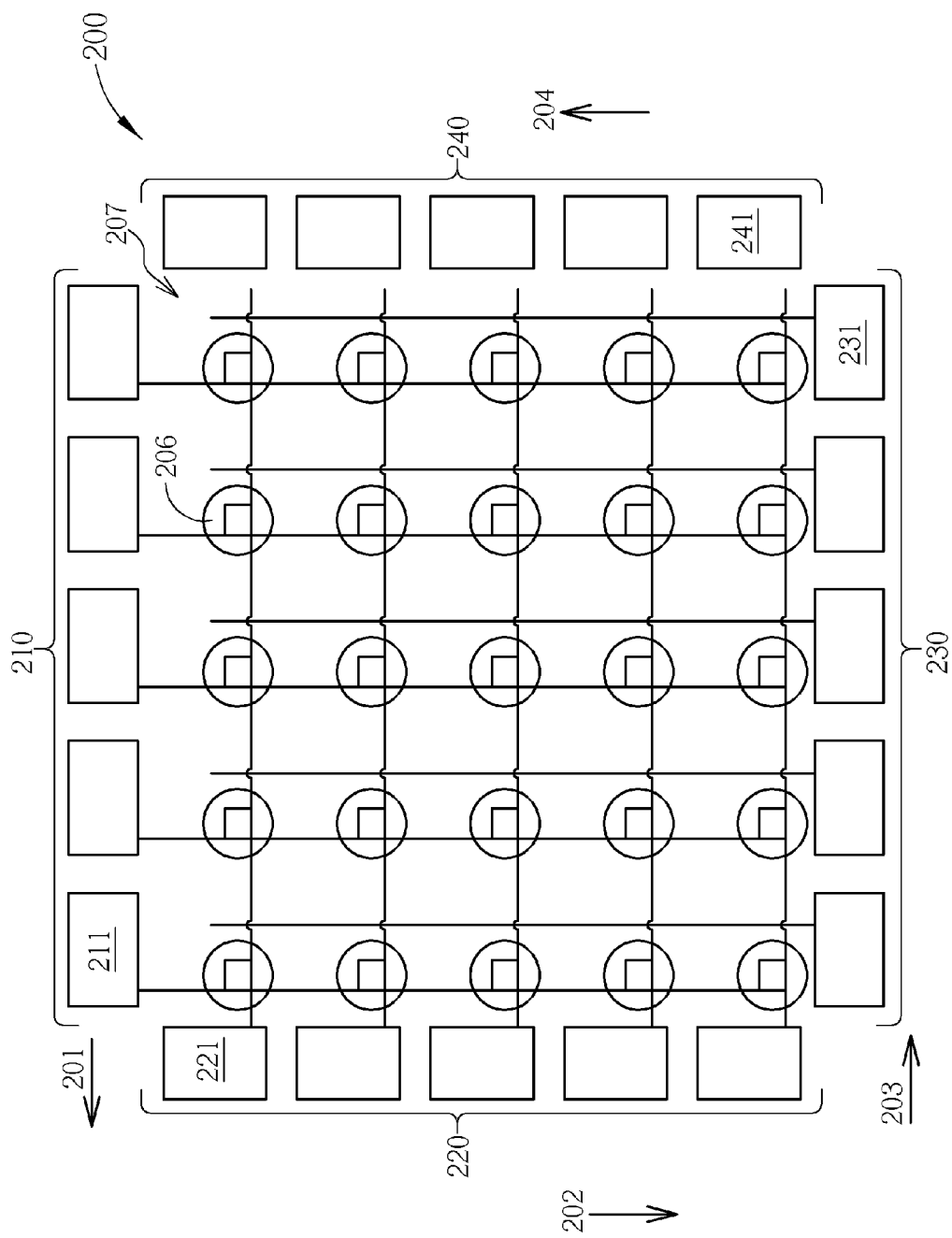
Figure 2C:
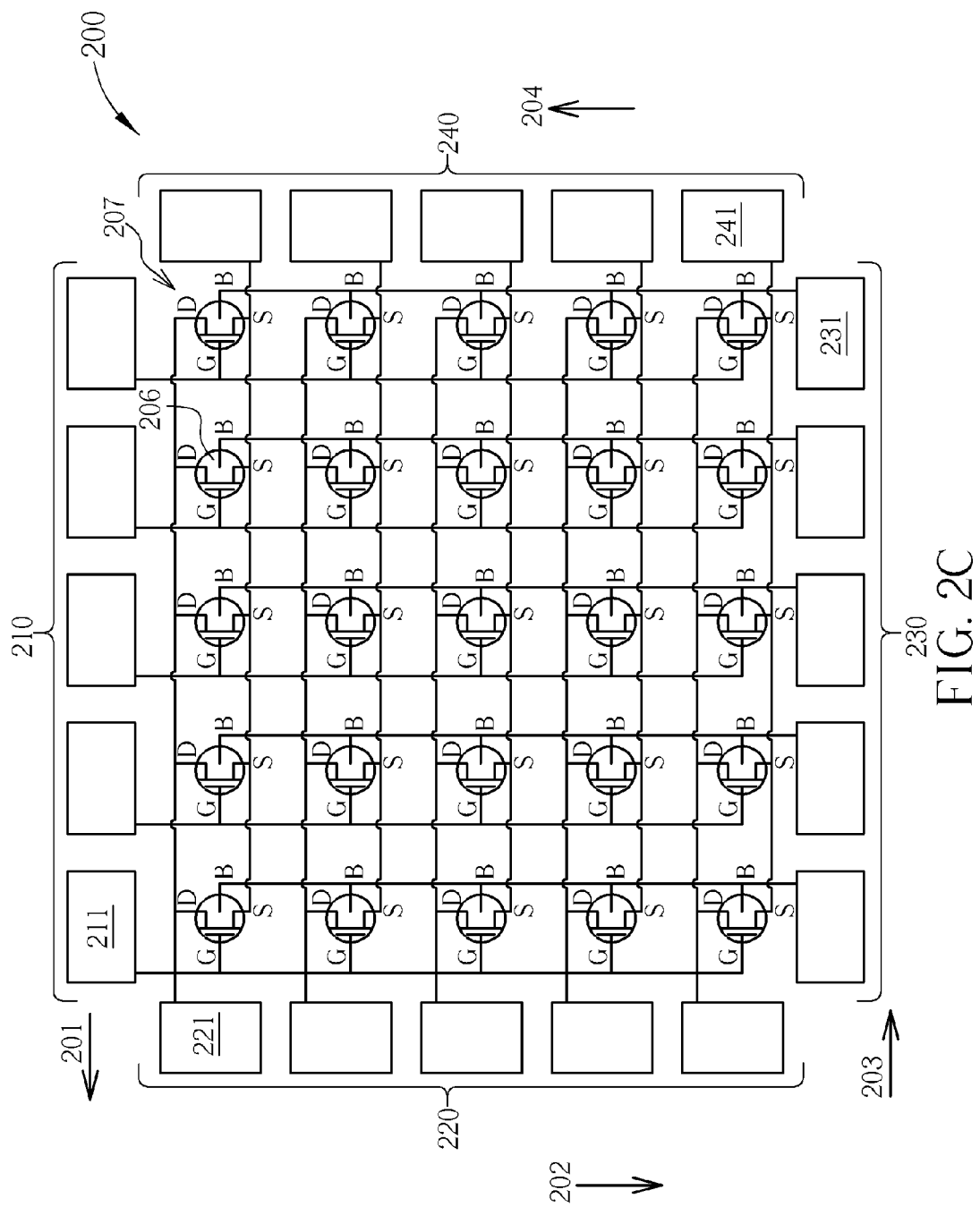

The present invention first provides a high density layout structure for electronic elements. The high density layout structure for electronic elements of the present invention may sufficiently utilize the limited space in the test key regions more economically to accommodate more electronic elements and the corresponding pads in a same area for the wafer acceptance test. FIGS. 2A, 2B and 2C illustrate an example of the high density layout structure for electronic elements of the present invention. Please refer to FIG. 2A, the layout structure 200 for electronic elements of the present invention includes M*N electronic elements 206 in a form of a matrix 207.

Besides, the layout structure 200 also includes a first test pad group 210 disposed on a first side 201 of the matrix 207 and a second test pad group 220 disposed on a second side 202 of the matrix 207. Optionally, the layout structure 200 for electronic elements may further include a third test pad group 230 disposed on a third side 203 of the matrix 207 and a fourth test pad group 240 disposed on a fourth side 204 of the matrix 207.

In the matrix 207, the M*N electronic elements 206 align themselves in a form of M lines and N rows, or N lines and M rows for instance. M and N may be the same or different. In one embodiment, a test pad 211 in the first test pad group 210 disposed on a first side 201 of the matrix 207 is electrically connected to all electronic elements 206 in a line or a row of the M linear sections. Or, all electronic elements 206 in a line or a row of the N linear sections are electrically connected to a corresponding test pad 221 in the second test pad group 220 on a second side 202 of the matrix 207. In other words, all the electronic elements 206 in the same line or in the same row are considered to share a common electrode. The number of test pads in a test pad group is usually not less than the number of linear sections of the matrix 207, so they may be for use as, for example redundancy.

If the electronic elements 206 are bipolar electronic elements, as shown in FIG. 2B, electric resistances for example, the two electrodes of the electronic elements 206 are respectively electrically connected to a corresponding test pad 211 of the first test pad group 210 and to a corresponding test pad 221 in the second test pad group 220. If the electronic elements 206 are tripolar electronic elements, transistors for example, the three electrodes of each of the electronic elements 206 are respectively electrically connected to a corresponding test pad 211 in the first test pad group 210, to a corresponding test pad 221 in the second test pad group 220 and to a corresponding test pad 231 in a third test pad group 230, or remain floating. In such a way, any one of the third test pad group 230 and the fourth test pad group 240 may be considered as a dummy pad group or does not exist. FIG. 2B illustrates a bipolar electronic elements, in which the third test pad group 230 is a dummy pad group and the fourth test pad group 240 is considered to be non-exist.

Figure 2D:
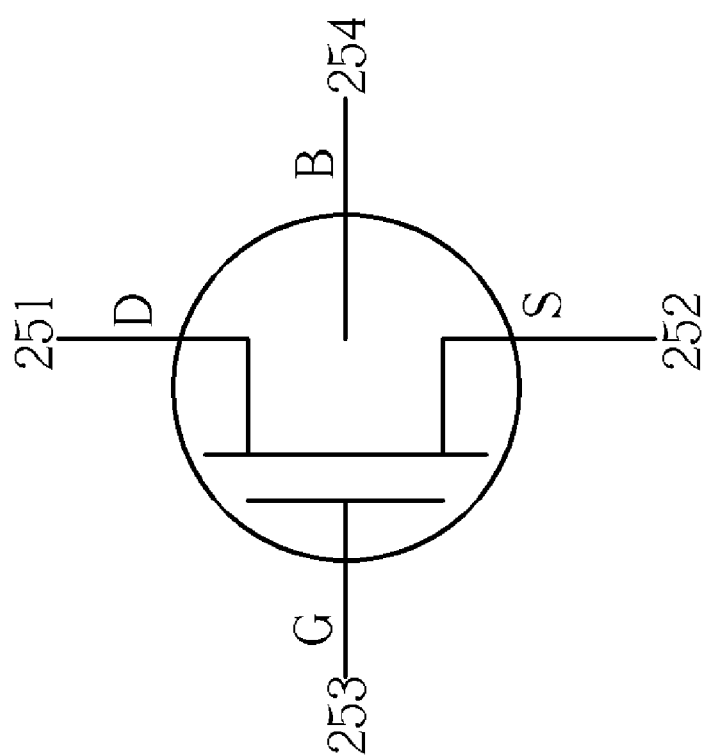

In another aspect, as shown in FIG. 2C, if the electronic elements 206 are quadrupole electronic elements, the four electrodes of each of the electronic element 206 are respectively electrically connected to a corresponding test pad 211 in the first test pad group 210, to a corresponding test pad 221 in the second test pad group 220, to a corresponding test pad 231 in a third test pad group 230 and to a corresponding test pad 241 in a fourth test pad group 240, so the electronic elements 206 may be a bipolar, tripolar or a quadrupole electronic element. FIG. 2D illustrates a quadrupole electronic elements.

For example, if the electronic elements 206 are quadrupole electronic elements and includes a source 252, a drain 251, a gate 253 and a base 254, the first test pad group 210, the second test pad group 220, the third test pad group 230 and the fourth test pad group 240 are respectively electrically connected to one of the source 252, the drain 251, the gate 253 and the base 254 of the electronic elements 206. No matter how many electrodes are there in the electronic elements 206, the first test pad group 210, the second test pad group 220, the optional third test pad group 230 and the optional fourth test pad group 240 are respectively different. The electronic elements are bipolar electronic elements, and the total number of the test pads 211, 221 in the first test pad group 210 and the second test pad group 220 is one of M+N, 2N and 2M. The electronic elements are tripolar electronic elements, and the total number of the test pads 211,221,231 in the first test pad group 210, the second test pad group 220 and the third test pad group 230 is one of 2M+N and 2N+M. The electronic elements are quadrupole electronic elements, and the total number of the test pads 211,221,231,241 in the first test pad group 210, the second test pad group 220, the third test pad group 230 and the fourth test pad group 240 is 2(M+N). The conductive wires and the test pads in the layout structure 200 for electronic elements of the present invention may be arranged in an alternate and electrically isolating form, such as different metal layers. For example, the multilayer metal layers (M1, M2, . . . Mn) and contact plugs in a conventional semiconductor process may be used for electronic elements of the present invention.

Because the first test pad group 210, the second test pad group 220, the optional third test pad group 230 and the optional fourth test pad group 240 are respectively disposed on one side of the matrix 207, the relationship among the test pad groups may be mutually vertical or horizontal, depending on the relative position of each one of the test pad group.

Because the electronic elements 206 of the present invention maybe regarded as sharing a same electrode, the high density layout structure for electronic elements of the present invention may sufficiently use the limited space in the test key regions more economically so that more electronic elements and the corresponding pads are accommodated in a same area. For example, if the size of the test key is 1540 μm*1540 μm=2371600 μm$^2$, and each one of the test pad group is still consist of 20 test pads, i.e. at most 20 test pads are arranged in a given linear section, there are 400 electronic elements 206 in total. The average area occupied by each one of the electronic element 206 is 2371600/400=5929 μm$^2$. Compared with the conventional layout structure, the average area occupied by each one of the electronic element 206 of the present invention is only 73% of the original electronic element 10.

Figure 3:
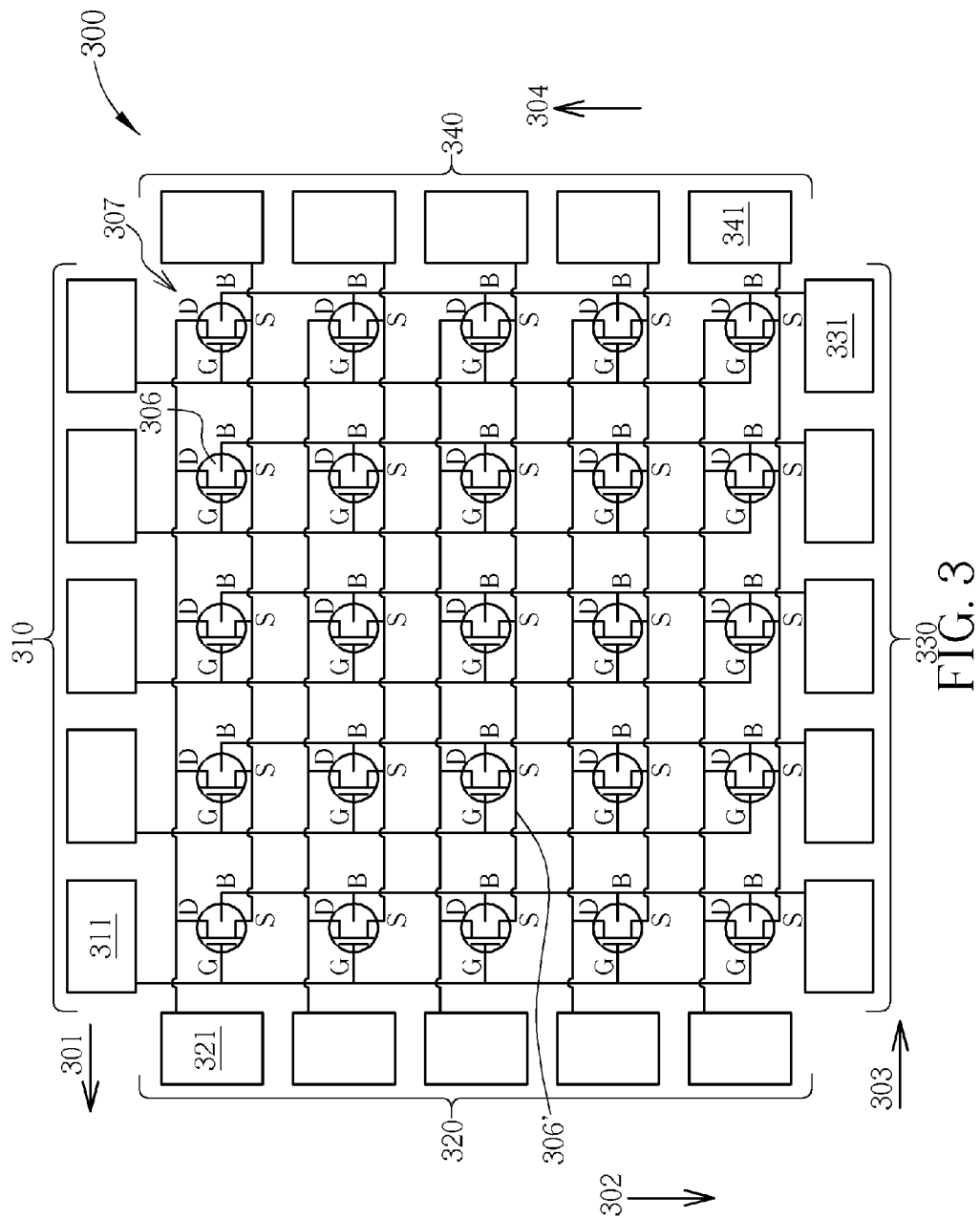
FIGS. 3-5 illustrate an example of the method for detecting an electronic element by means of addressing of the present invention.
Figure 4:
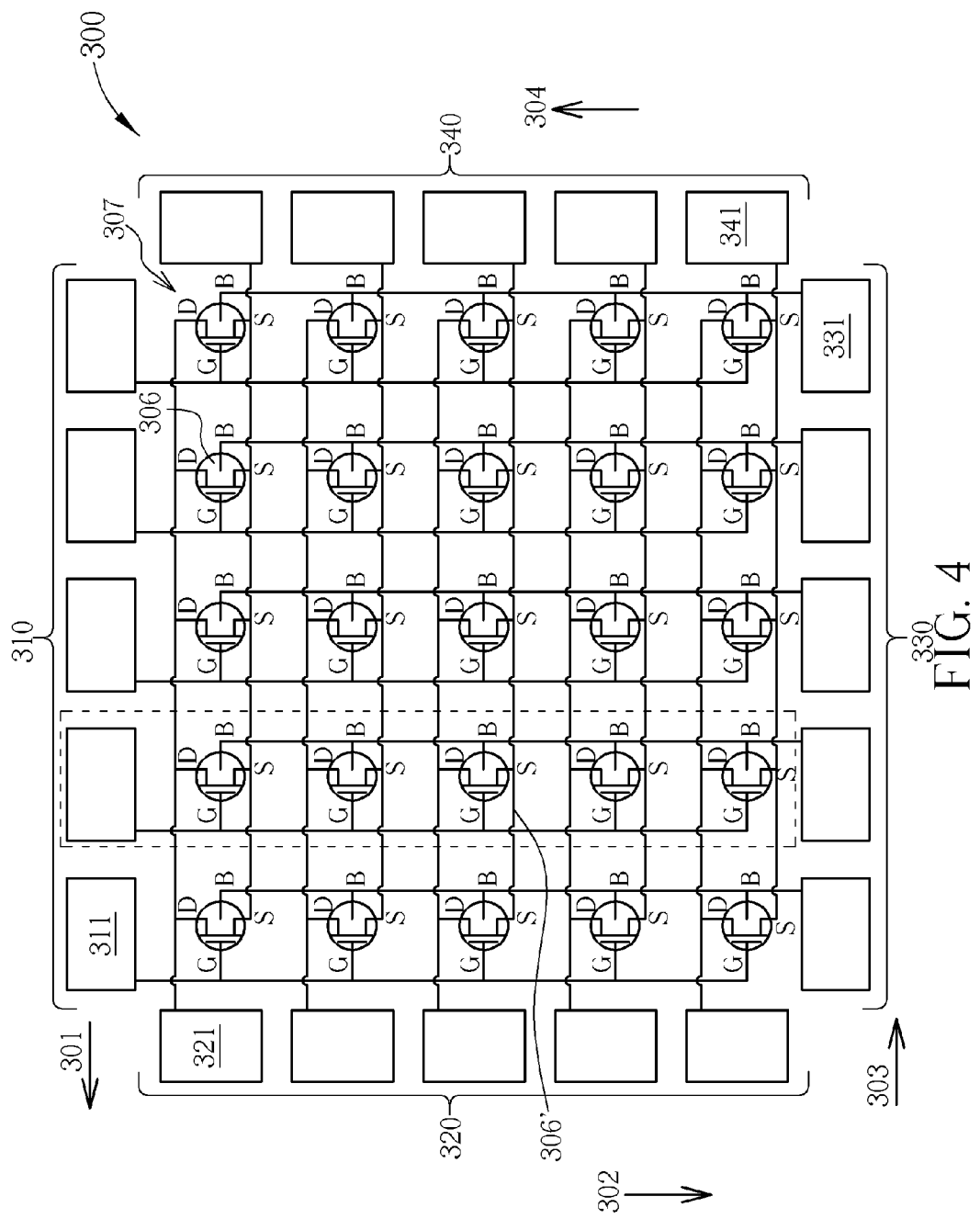
Figure 5:
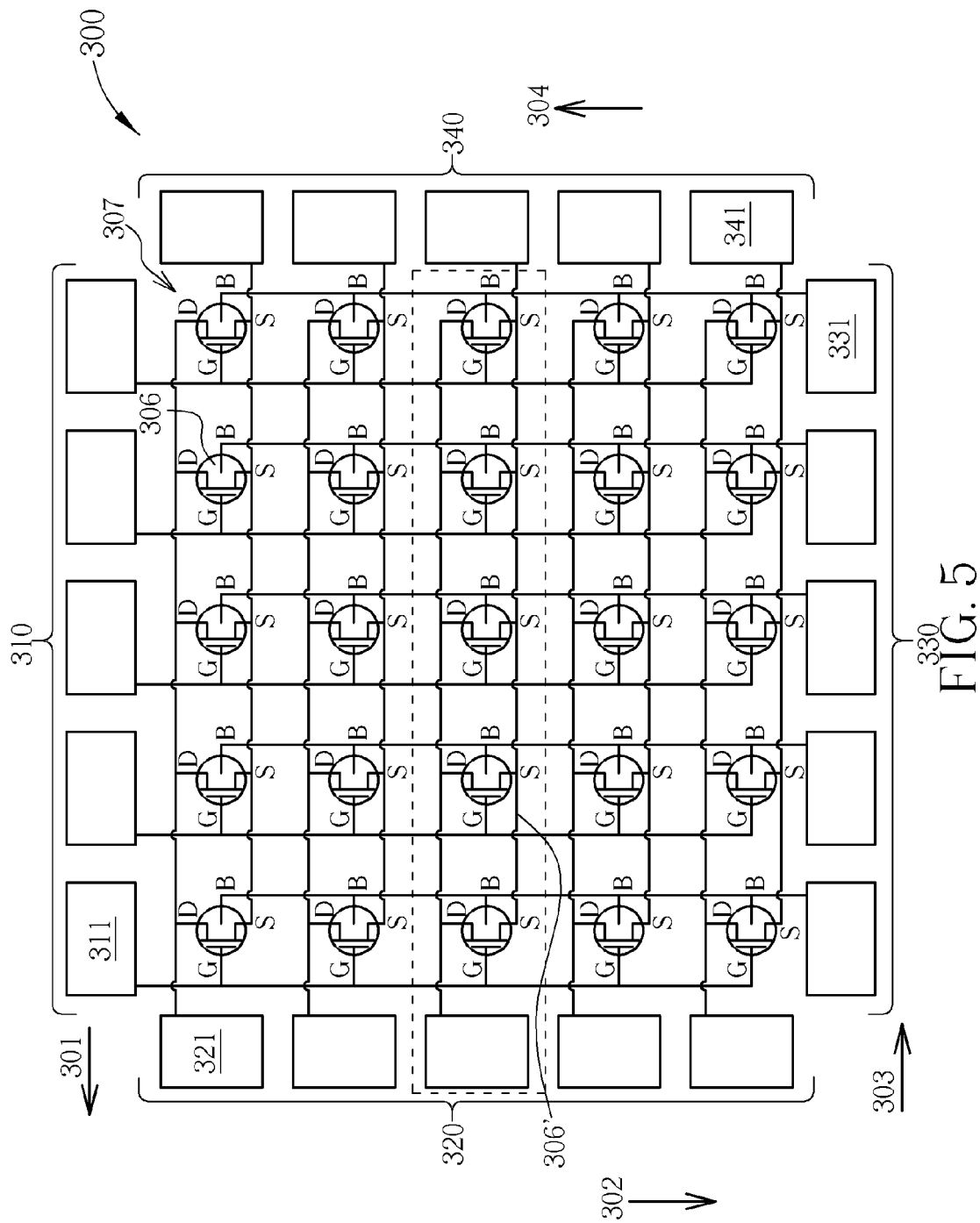

The present invention further provides a method for detecting an electronic element by means of addressing. FIGS. 3-5 illustrate an example of the method for detecting an electronic element by means of addressing of the present invention. As shown in FIG. 3, first, a layout structure 300 including M*N electronic elements 306 in a form of a matrix 307 is provided. The layout structure 300 for electronic elements of the present invention also includes a first test pad group 310 disposed on a first side 301 of the matrix 307 and a second test pad group 320 disposed on a second side 302 of the matrix 307. Optionally, the layout structure 300 for electronic elements further includes a third test pad group 330 disposed on a third side 303 of the matrix 307 and/or a fourth test pad group 340 disposed on a fourth side 304 of the matrix 307.

In the matrix 307, the M*N electronic elements 306 align themselves in a form of M lines and N rows, or N lines and M rows. M and N are integers and may be the same or different. In one embodiment, a test pad 311 in the first test pad group 310 disposed on a first side 301 of the matrix 307 is electrically connected to all electronic elements 306 in a line or a row of the M linear sections. Or, all electronic elements 306 in a line or a row of the N linear sections are electrically connected to a corresponding test pad 321 in the second test pad group 320 on a second side 302 of the matrix 307. This idea applies to the third test pad group 330 and the fourth test pad group 340, too. In other words, all the electronic elements 306 in the same line or in the same row are considered to share a common electrode. The number of test pads in a test pad group is usually not less than the number of linear sections of the matrix 307, so they may be for use as, for example redundancy.

The electronic element 306 may be a bipolar, tripolar or a quadrupole electronic element. If the electronic element 306 is a bipolar electronic element, an electric resistance for example, the two electrodes of the electronic elements 306 are respectively electrically connected to a corresponding test pad 311 of the first test pad group 310 and to a corresponding test pad 321 in the second test pad group 320. If the electronic element 306 is a tripolar electronic element, transistors for example, or a quadrupole electronic element, each electrode of every electronic element 306 is respectively electrically connected to a corresponding test pad in a given test pad group, or remain floating. In such a way, any one of the third test pad group 330 and the fourth test pad group 340 may be considered as a dummy pad group or to be non-exist. FIG. 3 illustrates quadrupole electronic elements.

If the electronic element 306 is a polypolar electronic element and includes a source S, a drain D, a gate G and/or a base B, the first test pad group 310, the second test pad group 320, the third test pad group 330 and the fourth test pad group 340 are respectively electrically connected to one of the source S, the drain D, the gate G and the base B of the electronic elements 306. No matter how many electrodes are there in the electronic elements 306, the first test pad group 310, the second test pad group 320, the optional third test pad group 330 and the optional fourth test pad group 340 are respectively different. The electronic elements are bipolar electronic elements, and the total number of the test pads 311, 321 in the first test pad group 310 and the second test pad group 320 is one of M+N, 2N and 2M. The electronic elements are tripolar electronic elements, and the total number of the test pads 311,321,331 in the first test pad group 310, the second test pad group 320 and the third test pad 330 is one of 2M+N and 2N+M. The electronic elements are quadrupole electronic elements, and the total number of the test pads 311,321,331, 341 in the first test pad group 310, the second test pad group 320, the third test pad group 330 and the fourth test pad group 240 is 2(M+N). The conductive wires and the test pads in the layout structure 300 for electronic elements of the present invention may be arranged in an alternate and electrically isolating form, such as different metal layers. For example, the multilayer metal layers (M1, M2, ... Mn) and contact plugs in a conventional semiconductor process may be used in the layout structure 300 for electronic elements of the present invention. Because the first test pad group 310, the second test pad group 320, the optional third test pad group 330 and the optional fourth test pad group 340 are respectively disposed on one side of the matrix 307, the relationship among the test pad groups may be mutually vertical or horizontal, depending on the relative position of each one of the test pad group.

Second, as shown in FIG. 4, a corresponding test pad 311 in the first test pad group 310 is electrically connected to activate all electronic elements 306 in the same linear section of the matrix 307. Now, only the chosen electronic elements 306 in the same linear section are activated. Then, as shown in FIG. 5, a corresponding test pad 321 in the second test pad group 320 is electrically connected to select a specific electronic element 306' by means of addressing. Because the previously chosen electronic elements 306 in the same linear section are respectively and independently electrically connected to the corresponding test pads in the second test pad group 321, only a specific electronic element 306' in the same linear section is influenced when a test pad 321 in the second test pad group 321 is electrically connected. Accordingly, a specific electronic element 306' is detected. If the electronic element 306 is a tripolar electronic element or a quadrupole electronic element, any specific electronic element 306' may be turned on and detected in accordance with the similar steps. For example, a test pad in the third test pad group 330 and or a test pad in the fourth test pad group 340 is electrically connected to detect a specific electronic element without influencing all the other electronic element 306 in the same matrix.

Those skilled in the art will readily observe that numerous modifications and alterations of the device and method may be made while retaining the teachings of the invention.

What is claimed is:

1. A layout structure of electronic elements, comprising:
M*N electronic elements in a form of a matrix;
a first test pad group disposed on a first side of said matrix, and all electronic elements in the same linear section of said matrix electrically connected to a corresponding test pad in said first test pad group;
a second test pad group disposed on a second side of said matrix, and all electronic elements in the same linear section of said matrix electrically connected to a corresponding test pad in said second test pad group;
a third test pad group disposed on a third side of said matrix, and all electronic elements in the same linear section of said matrix electrically connected to a corresponding test pad in said third test pad group; and
a fourth test pad group disposed on a fourth side of said matrix, and all electronic elements in the same linear section of said matrix electrically connected to a corresponding test pad in said fourth test pad group.

2. The layout structure of electronic elements of claim 1, wherein said first side is normal to said second side.

3. The layout structure of electronic elements of claim 1, wherein said first side is parallel with said second side.

4. The layout structure of electronic elements of claim 1, wherein said first test pad group and said second test pad group are respectively electrically connected to a source, a drain, a gate and a base.

5. The layout structure of electronic elements of claim 1, wherein the electronic elements are bipolar electronic elements, and the total number of the test pads in said first test pad group and said second test pad group is one of M+N, 2N and 2M.

6. The layout structure of electronic elements of claim 1, wherein said first side is normal to said third side.

7. The layout structure of electronic elements of claim 1, wherein said first side is parallel with said third side.

8. The layout structure of electronic elements of claim 1, wherein said third test pad group is electrically connected to a source, a drain, a gate and a base.

9. The layout structure of electronic elements of claim 1, wherein said third test pad group is a dummy test pad group.

10. The layout structure of electronic elements of claim 1, wherein the electronic elements are tripolar electronic elements, and the total number of the test pads in said first test pad group, said second test pad group and said third test pad is one of 2M+N and 2N+M.

11. The layout structure of electronic elements of claim 1, wherein said fourth test pad group is electrically connected to a source, a drain, a gate and a base.

12. The layout structure of electronic elements of claim 1, wherein said fourth test pad group is a dummy test pad group.

13. The layout structure of electronic elements of claim 1, wherein the electronic elements are quadrupole electronic elements, and the total number of the test pads in said first test pad group, said second test pad group, said third test pad group and said fourth test pad group is 2(M+N).

14. The layout structure of electronic elements of claim 1,wherein the test pads in said first test pad group are disposed on different metal layers.

15. The layout structure of electronic elements of claim 1, wherein the test pads in said second test pad group are disposed on different metal layers.

16. The layout structure of electronic elements of claim 1, wherein the test pads in said third test pad group are disposed on different metal layers.

17. The layout structure of electronic elements of claim 1, wherein the test pads in said fourth test pad group are disposed on different metal layers.

18. A method for detecting an electronic element by addressing, comprising:
providing a layout structure, comprising:
M*N electronic elements in a form of a matrix;
a first test pad group disposed on a first side of said matrix, and all electronic elements in the same linear section of said matrix electrically connected to a corresponding test pad in said first test pad group; and
a second test pad group disposed on a second side of said matrix, and all electronic elements in the same linear section of said matrix electrically connected to a corresponding test pad in said second test pad group;
electrically connecting said corresponding test pad in said first test pad group to activate all electronic elements in the same linear section of said matrix;
electrically connecting said corresponding test pad in said second test pad group to select a specific electronic element by addressing;
detecting said specific electronic element;
providing a third test pad group disposed on a third side of said matrix, and all electronic elements in the same linear section of said matrix electrically connected to a corresponding test pad in said third test pad group; and
providing a fourth test pad group disposed on a fourth side of said matrix, and all electronic elements in the same linear section of said matrix electrically connected to a corresponding test pad in said fourth test pad group.

19. The method of claim 18, wherein said first side is normal to said second side.

20. The method of claim 18, wherein said first side is parallel with said second side.

21. The method of claim 18, wherein said first test pad group and said second test pad group are respectively electrically connected to a source, a drain, a gate and a base.

22. The method of claim 18, wherein said first side is normal to said third side.

23. The method of claim 18, wherein said first side is parallel with said third side.

24. The method of claim 18, wherein said third test pad group is electrically connected to a source, a drain, a gate and a base.

25. The method of claim 18, wherein said third test pad group is a dummy test pad group.

26. The method of claim 18, further comprising:
electrically connecting said corresponding test pad in said third test pad group to detect said specific electronic element.

27. The method of claim 18, wherein said fourth test pad group is electrically connected to a source, a drain, a gate and a base.

28. The method of claim 18, wherein said fourth test pad group is a dummy test pad group.

29. The method of claim 18, further comprising:
electrically connecting said corresponding test pad in said fourth test pad group to detect said specific electronic element.

30. The layout structure of electronic elements of claim 18, wherein the test pads in said first test pad group are disposed on different metal layers.

31. The layout structure of electronic elements of claim 18, wherein the test pads in said second test pad group are disposed on different metal layers.

32. The layout structure of electronic elements of claim 18, wherein the test pads in said third test pad group are disposed on different metal layers.

33. The layout structure of electronic elements of claim 18, wherein the test pads in said fourth test pad group are disposed on different metal layers.

* * * * *